(12) United States Patent
Kanno et al.

(10) Patent No.: US 11,342,354 B2
(45) Date of Patent: May 24, 2022

(54) SEMICONDUCTOR STORAGE DEVICE WITH IMPROVED RELIABILITY

(71) Applicant: KIOXIA CORPORATION, Tokyo (JP)

(72) Inventors: Yosuke Kanno, Yokkaichi Mie (JP); Katsuyuki Kitamoto, Yokkaichi Mie (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 16/805,400

(22) Filed: Feb. 28, 2020

(65) Prior Publication Data

US 2021/0091107 A1 Mar. 25, 2021

(30) Foreign Application Priority Data

Sep. 19, 2019 (JP) .............................. JP2019-170455

(51) Int. Cl.
| | |
|---|---|
| *H01L 27/11565* | (2017.01) |
| *H01L 27/11582* | (2017.01) |
| *H01L 23/528* | (2006.01) |
| *H01L 21/311* | (2006.01) |
| *H01L 21/28* | (2006.01) |
| *H01L 21/02* | (2006.01) |

(52) U.S. Cl.
CPC ...... *H01L 27/11582* (2013.01); *H01L 23/528* (2013.01); *H01L 27/11565* (2013.01); *H01L 21/02532* (2013.01); *H01L 21/31111* (2013.01); *H01L 29/40117* (2019.08)

(58) Field of Classification Search
CPC .................................................. H01L 27/11565
See application file for complete search history.

(56) References Cited

U.S. PATENT DOCUMENTS

| | | | |
|---|---|---|---|
| 7,910,976 B2 * | 3/2011 | Fastow | H01L 27/115 |
| | | | 257/316 |
| 9,397,043 B1 * | 7/2016 | Minemura | H01L 27/11575 |
| 2019/0096899 A1 | 3/2019 | Tagami et al. | |

FOREIGN PATENT DOCUMENTS

JP 2019-067825 A 4/2019

\* cited by examiner

*Primary Examiner* — Stephen M Bradley
*Assistant Examiner* — Gustavo G Ramallo
(74) *Attorney, Agent, or Firm* — Foley & Lardner LLP

(57) ABSTRACT

A semiconductor storage device includes a stacked body including conductive layers stacked in a first direction; columnar bodies of a first group extending in the first direction in the stacked body, wherein memory cell transistors are respectively formed at intersections of the conductive layers and the columnar bodies of the first group; columnar bodies of a second group that are arranged in a second direction, and respectively include an insulating material; and an insulating film extending in the first direction and the second direction in the stacked body, and divides the stacked body to include a first portion adjacent to the columnar bodies of the first group, a second portion adjacent to the columnar bodies of the second group, a third portion between the first portion and the second portion, and a first protruding part protruding from one side surface in the third direction in the third portion.

14 Claims, 13 Drawing Sheets

SEMICONDUCTOR STORAGE DEVICE WITH IMPROVED RELIABILITY

CROSS-REFERENCE TO RELATED APPLICATION(S)

This application is based upon and claims the benefit of priority from Japanese Patent Application No. 2019-170455, filed Sep. 19, 2019, the entire contents of which are incorporated herein by reference.

FIELD

Embodiments described herein relate generally to a semiconductor storage device.

BACKGROUND

As one of the semiconductor storage devices, a NAND type flash memory in which a memory cell is three-dimensionally stacked is known.

Examples of related art include JP-A-2019-67825.

DETAILED DESCRIPTION

Embodiments provide a semiconductor storage device capable of improving reliability.

In general, according to one embodiment, a semiconductor storage device includes: a stacked body including a plurality of conductive layers stacked in a first direction; a plurality of columnar bodies of a first group that extend in the first direction in the stacked body, wherein a plurality of memory cell transistors are respectively formed at intersections of the conductive layers and the columnar bodies of the first group; a plurality of columnar bodies of a second group that are arranged in a second direction intersecting the first direction, and respectively include an insulating material; and an insulating film that extends in the first direction and the second direction in the stacked body, and divides the stacked body in a third direction intersecting the first direction and the second direction to include a first portion adjacent to the plurality of columnar bodies of the first group, a second portion adjacent to the plurality of columnar bodies of the second group, a third portion between the first portion and the second portion, and a first protruding part protruding from at least one side surface in the third direction in the third portion.

Hereinafter, a semiconductor storage device according to an embodiment will be described with reference to the accompanying drawings. In the following description, configurations having the same or similar functions will be denoted by the same reference sign. The configurations having the same or similar functions may not be repeatedly described. "Parallel", "orthogonal", "same", and "equivalent" described in the specification respectively include "approximately parallel", "approximately orthogonal", "approximately same", and "approximately equivalent".

As used herein, the term "connection" is intended to include not only physical connection but also electrical connection. Specifically, "connection" is intended to include not only cases where two members are directly in contact with each other, but also cases where another member is interposed between the two members. As used herein, the term "contact" may mean direct contact. As used herein, the terms "overlapping", "facing", and "adjacent" are intended to include cases where two members directly face each other or contact each other, but also cases where a member different from the two members exists therebetween.

First Embodiment

Figure 1:
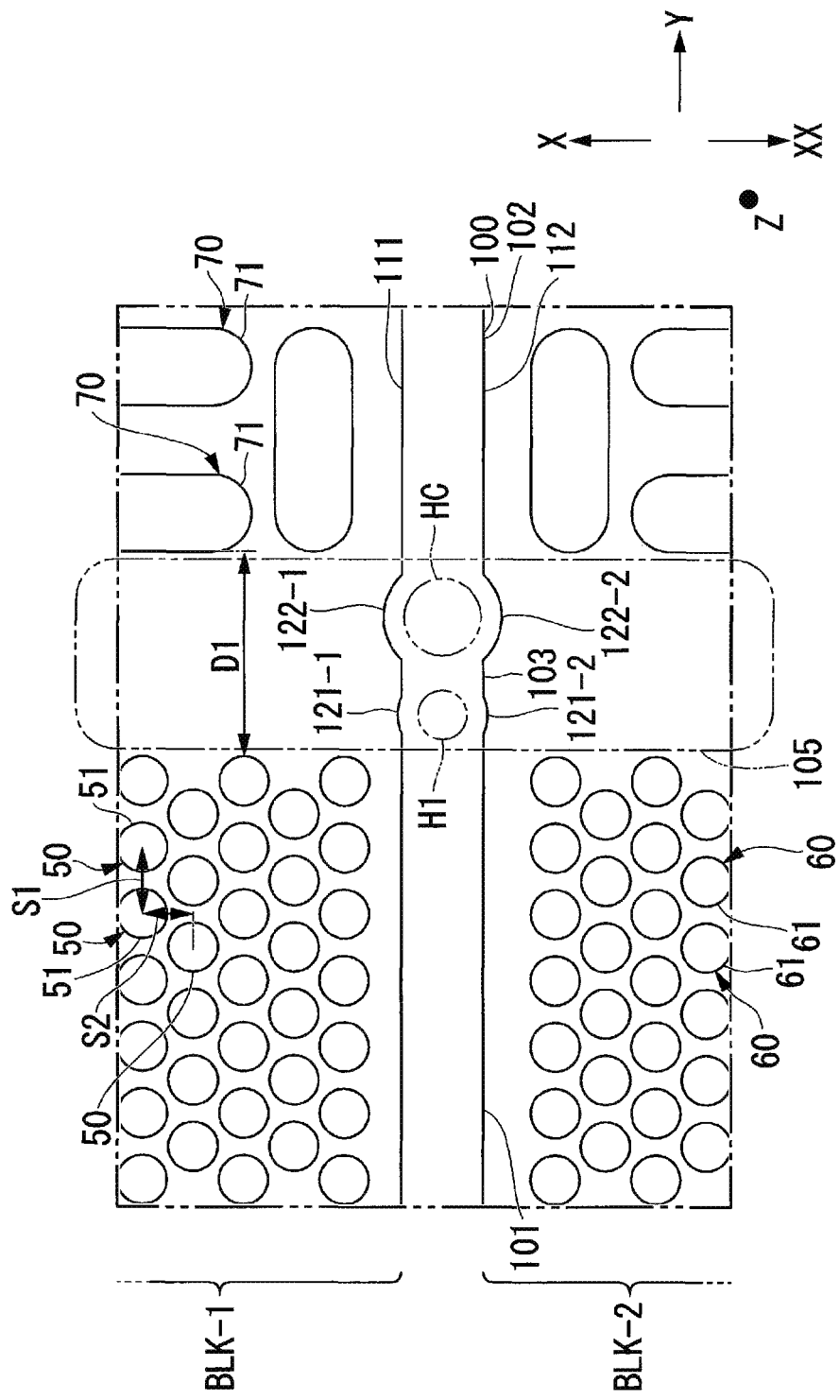
FIG. 1 is a plan view of a semiconductor storage device according to a first embodiment.
Figure 2:
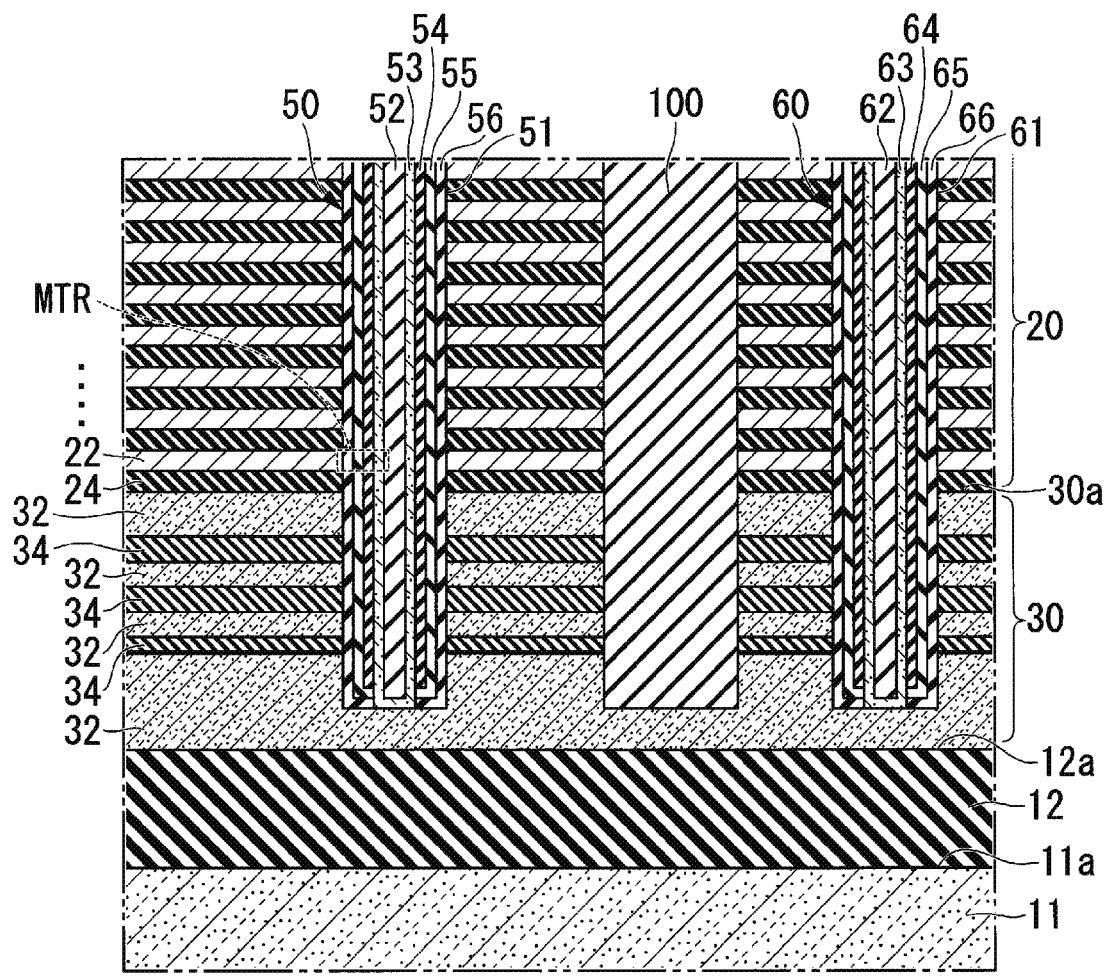
FIG. 2 is a cross-sectional view of the semiconductor storage device.

First, a configuration of a semiconductor storage device 1 according to a first embodiment will be described. FIG. 1 is a plan view of a main part of the semiconductor storage device 1. FIG. 2 is a cross-sectional view of the main part of the semiconductor storage device 1 when viewed from a Y direction. In the following description, a X direction (third direction) is a direction parallel to a surface 11*a* of a silicon substrate (substrate) 11, and a direction in which a bit line BL extends. A Y direction (second direction) is a direction parallel to the surface 11*a* of the silicon substrate 11, a direction that intersects the X direction, and a direction in which a word line WL extends. For example, the Y direction is approximately orthogonal to the X direction. A Z direction (first direction) is a thickness direction of the silicon substrate 11, and a direction that intersects the X direction and the Y direction. For example, the Z direction is approximately orthogonal to the X direction and the Y direction.

As illustrated in FIGS. 1 and 2, the semiconductor storage device 1 is a non-volatile storage device and a three-dimensional NAND type flash memory. The semiconductor storage device 1 includes, for example, the silicon substrate 11, a wiring layer 30, a stacked body 20, a plurality of columnar bodies 50 of a first group, a plurality of columnar bodies 70 of a second group, a plurality of columnar bodies 60 of a third group, and an insulating film 100.

The silicon substrate 11 extends in the X direction and the Y direction and has a predetermined thickness in the Z direction. A peripheral circuit and a drive circuit (not illustrated) of the semiconductor storage device 1 are formed on the surface 11a of the silicon substrate 11. An insulating layer 12 is stacked on the surface 11a of the silicon substrate 11. The insulating layer 12 covers the above-described drive circuit. The insulating layer 12 is formed of, for example, tetraethoxysilane (TEOS) and silicon oxide ($SiO_2$).

The wiring layer 30 is formed on a surface 12a of the insulating layer 12. The wiring layer 30 is provided between the silicon substrate 11 and the stacked body 20. The wiring layer 30 includes, for example, a plurality of semiconductor layers 32 and a plurality of insulating layers 34 in order from the side close to the silicon substrate 11 in the Z direction. The plurality of semiconductor layers 32 and the plurality of insulating layers 34 are alternately stacked in the Z direction. Respective thicknesses in the Z direction of the plurality of semiconductor layers 32 and the plurality of insulating layers 34 are different from each other. The semiconductor layer 32 is formed of, for example, polycrystalline silicon (Si). The insulating layer 34 is formed of, for example, silicon oxide ($SiO_2$). The stacked body 20 is formed on a surface 30a of the wiring layer 30.

The stacked body 20 includes, for example, a plurality of conductive layers 22 and a plurality of insulating layers 24. The plurality of conductive layers 22 and the plurality of insulating layers 24 are alternately stacked in the Z direction. The conductive layer 22 is formed of, for example, tungsten (W). The insulating layer 24 is formed of, for example, silicon oxide. An upper wiring, and the like are formed on the surface of the stacked body 20, and the upper wiring, and the like are omitted in FIGS. 1 and 2.

The plurality of columnar bodies 50 of the first group extend in the Z direction inside the stacked body 20. A memory cell transistor MTR is formed at an intersection portion of the plurality of columnar bodies 50 of the first group and the conductive layer 22. That is, the plurality of columnar bodies 50 of the first group are a plurality of memory cells MC of the semiconductor storage device 1. The plurality of columnar bodies 50 of the first group are arranged at a first interval S1 in the Y direction. The first interval S1 is a separation distance between centers viewed from the Z direction of the columnar bodies 50 adjacent to each other in the Y direction.

The plurality of columnar bodies 50 of the first group include a first columnar body 51. The first columnar body 51 includes a core 52, a channel film 53, a tunnel film 54, a charge storage film 55, and a barrier film 56. The core 52, the channel film 53, the tunnel film 54, the charge storage film 55, and the barrier film 56 are arranged in the above-described order from a center of the first columnar body 51 to the outside when viewed from the Z direction. The core 52 is formed of, for example, an insulator such as silicon oxide. The channel film is formed of, for example, a semiconductor such as polysilicon partially doped with an impurity. The impurity contained in the channel film 53 is, for example, any one selected from a group formed of carbon (C), phosphorus (P), boron (Br), and germanium (Ge). The tunnel film 54 is formed of, for example, an insulator such as silicon oxide. The charge storage film 55 is formed of, for example, an insulator such as silicon nitride (SiN). The barrier film 56 is formed of, for example, an insulator such as silicon oxide ($SiO_2$), aluminum oxide ($Al_3O_2$), and zirconium oxide (ZnO).

The plurality of columnar bodies 70 of the second group are separated from the plurality of columnar bodies 50 of the first group by a first distance D1 in the Y direction. The first distance D1 is a separation distance between an end in the Y direction when viewed from the Z direction of the columnar body 50 located in the most Y direction and an end in a direction opposite to the Y direction when viewed from the Z direction of the columnar body 70 which is adjacent to the columnar body 50 in the Y direction. The first distance D1 is greater than the first interval S1. The plurality of columnar bodies 70 of the second group respectively include an insulating material or a conductive material. The insulating material is, for example, silicon oxide. The conductive material is, for example, tungsten (W).

The plurality of columnar bodies 70 of the second group extend in the Z direction inside the stacked body 20. The plurality of columnar bodies 70 of the second group are respectively connected to peripheral circuits and drive circuits provided on the silicon substrate 11. That is, the plurality of columnar bodies 70 of the second group are a plurality of contact plugs of the semiconductor storage device 1. In the Y direction, a staircase region which is not illustrated and a plurality of columnar bodies are provided in a region opposite to a boundary region with respect to a region where the plurality of columnar bodies 70 of the second group are disposed. In the staircase region, as the conductive layer 22 is further separated from the silicon substrate 11 in the Z direction among the plurality of conductive layers 22 of the stacked body 20, an end in the Y direction of the conductive layer 22 approaches the plurality of columnar bodies 50 of the first group in the Y direction. Each of the plurality of columnar bodies extends in the Z direction in the staircase region, and connects each upper wiring which is not illustrated and each end in the Y direction of the plurality of conductive layers 22. The plurality of columnar bodies 70 of the second group include a second columnar body 71. A width in the X direction and the Y direction of the second columnar body 71 is greater than a width in the X direction and the Y direction of the first columnar body 51.

The insulating film 100 is provided in a film shape standing on the surface 11a of the silicon substrate 11 inside the stacked body 20. The insulating film 100 divides the stacked body 20 in the X direction. The insulating film 100 includes a first portion 101, a second portion 102, and a third portion 103. The first portion 101 is adjacent to the plurality of columnar bodies 50 of the first group in the X direction. The second portion 102 is adjacent to the plurality of columnar bodies 70 of the second group in the X direction. The third portion 103 exists between the first portion 101 and the second portion 102 in the Y direction, and is adjacent to a boundary region 105 in the X direction. The boundary region 105 is formed between the plurality of columnar bodies 50 of the first group and the plurality of columnar bodies 70 of the second group in the Y direction.

The insulating film 100 includes a first side surface (side surface) 111 and a second side surface (side surface) 112. The first side surface 111 is along the Y direction. The second side surface 112 is located on the side opposite to the first side surface 111 along the Y direction. The first side surface 111 and the second side surface 112 include circular arc-shaped first protruding parts 121-1 and 121-2 when viewed from the Z direction. The circular arc-shaped first protruding part 121-1 protrudes in the X direction at a location adjacent to the boundary region 105 in the X direction in a cross section parallel to the surface 11a of the silicon substrate 11. The circular arc-shaped first protruding part 121-2 protrudes in the XX direction (third direction) opposite to the X direction at the location adjacent to the boundary region 105 in the X direction in the cross section parallel to the surface 11a of the silicon substrate 11.

The columnar bodies 60 of the third group exist with the insulating film 100 interposed therebetween in the X direction with respect to the columnar bodies 50 of the first group. The memory cell transistor MTR is formed at an intersection portion of the plurality of columnar bodies 60 of the third group and the conductive layer 22. That is, the plurality of columnar bodies 60 of the third group are the plurality of memory cells MC of the semiconductor storage device 1. The plurality of columnar bodies 60 of the third group include a third columnar body 61. The third columnar body 61 includes a core 62, a channel film 63, a tunnel film 64, a charge storage film 65, and a barrier film 66. A role and a material of the core 62 are the same as those of the core 52. A role and a material of the channel film 63 are the same as those of the channel film 53. A role and a material of the tunnel film 64 are the same as those of the tunnel film 54. A role and a material of the charge storage film 65 are the same as those of the charge storage film 55. A role and a material of the barrier film 66 are the same as those of the barrier film 56.

The columnar bodies 50 of the first group are arranged at a second interval S2 in the X direction. The second interval S2 is a separation distance between the centers viewed from the Z direction of the columnar bodies 50 adjacent to each other in the X direction. The columnar bodies 60 of the third group are separated from the columnar bodies 50 of the first group by the second distance D2 in the X direction. The second distance D2 is a separation distance between an end of the XX direction when viewed from the Z direction of the columnar 50 located in the most XX direction and an end of the X direction when viewed from the Z direction of the columnar body 60 which is adjacent to the columnar body 50 in the x direction. The second distance D2 is greater than the second interval S2. The insulating film 100 is an insulating slit ST which divides a block BLK-1 of the stacked body 20 in which the plurality of columnar bodies 50 of the first group are disposed and a block BLK-2 of the stacked body 20 in which the plurality of columnar bodies 60 of the third group are arranged in the X direction. That is, the insulating film 100 is located between the columnar bodies 50 of the first group and the columnar bodies 60 of the third group in the X direction.

The first side surface 111 and the second side surface 112 of the insulating film 100 respectively include second protruding parts 122-1 and 122-2 at a location adjacent to the boundary region (region between the plurality of columnar bodies of the first group and the plurality of columnar bodies of the second group) 105 in the Y direction. The second protruding part 122-1 protrudes in a circular arc shape in the same X direction as the first protruding part 121-1. The second protruding part 122-2 protrudes in a circular arc shape in the same XX direction as the first protruding part 121-2.

The first protruding parts 121-1 and 121-2 are located closer to the plurality of columnar bodies 50 of the first group than the plurality of columnar bodies 70 of the second group in the Y direction. The second protruding parts 122-1 and 122-2 are located closer to the plurality of columnar bodies 70 of the second group than the plurality of columnar bodies 50 of the first group in the Y direction. A protruding amount in the X direction of the second protruding part 122-1 is greater than a protruding amount in the X direction of the first protruding part 121-1. A protruding amount in the XX direction of the second protruding part 122-2 is greater than a protruding amount in the XX direction of the first protruding part 121-2.

Next, a manufacturing method of the memory cell MC and the insulating slit ST of the semiconductor storage device 1 will be briefly described. Respective drawings from FIGS. 3 to 6 are cross-sectional views illustrating an example of a manufacturing process of the memory cell MC and the insulating slit ST.

Figure 3:
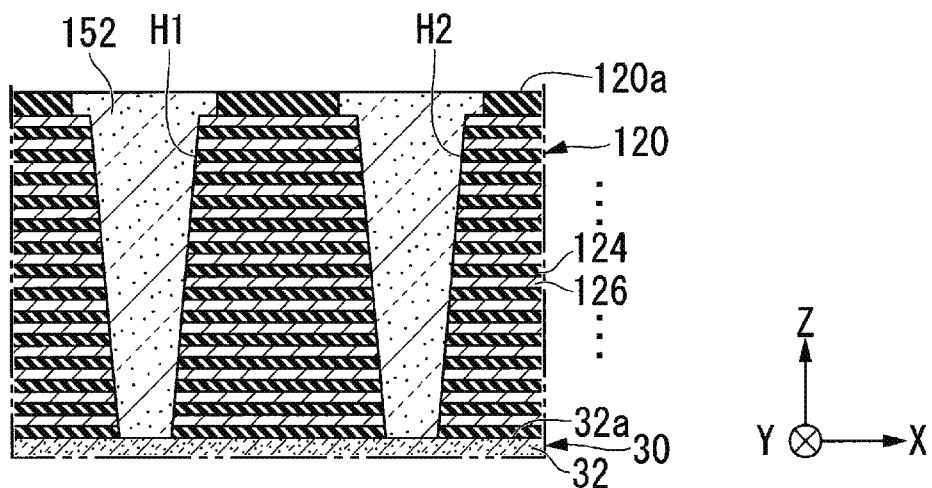
FIG. 3 is a cross-sectional view illustrating an example of a manufacturing process of a memory cell and an insulating slit according to the first embodiment.

As illustrated in FIG. 3, a conductive layer 126 and an insulating layer 124 are alternately stacked on the surface 30a of the wiring layer 30, thereby forming a stacked body 120. For example, the conductive layer 126 is formed of tungsten. For example, the insulating layer 124 is formed of silicon oxide. Next, a hole H1 and a plurality of holes H2 are formed in the stacked body 120 at a predetermined interval in the X direction and the Y direction (Y direction is not illustrated). A location where the hole H1 is formed in the X direction is an intermediate location between the first protruding parts 121-1 and 121-2 of the insulating film 100. A location where the hole H1 is formed in the Y direction is a location where the hole H1 overlaps the first protruding parts 121-1 and 121-2. A location where the plurality of holes H2 are formed in the X direction and the Y direction is the same as a location of the first columnar body 51 in the plurality of columnar bodies 50 of the first group. A surface 32a of the semiconductor layer 32 of the wiring layer 30 is exposed at bottom parts of the holes H1 and H2. Next, a contact hole is formed at an intermediate location between the second protruding parts 122-1 and 122-2 in the X direction and at a location where the contact hole overlaps the second protruding parts 122-1 and 122-2 in the Y direction.

A sacrificial layer 152 is filled in holes H1 and H2 from the surface 30a of the wiring layer 30 to a surface 120a of the stacked body 120 in the Z direction. The sacrificial layer 152 is widened along a plane intersecting the Z direction in the vicinity of the surface 120a of the stacked body 120 in the Z direction. For example, the sacrificial layer 152 is formed of amorphous silicon (aSi).

Figure 4:
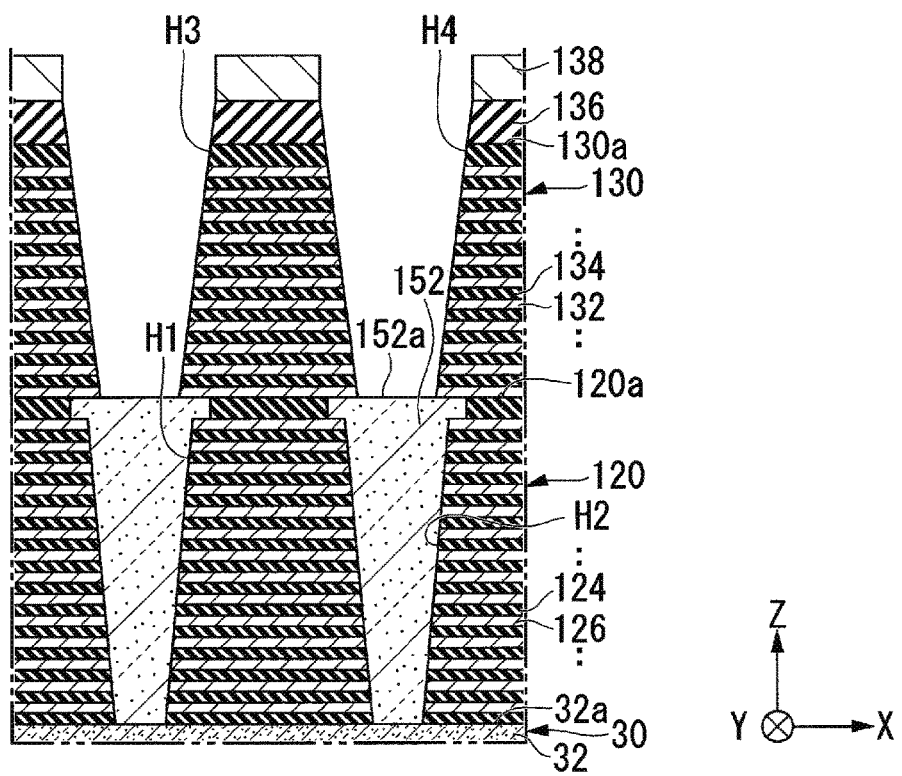
FIG. 4 is a cross-sectional view illustrating an example of the manufacturing process of the memory cell and the insulating slit.

As illustrated in FIG. 4, a conductive layer 132 and an insulating layer 134 are alternately stacked on the surface 120a of the stacked body 120 and a surface 152a of the sacrificial layer 152, thereby forming a stacked body 130. For example, the conductive layer 132 is formed of tungsten. For example, the insulating layer 134 is formed of silicon oxide. An insulating layer 136 and a conductive layer 138 are sequentially stacked on a surface 130a of the stacked body 130. For example, the insulating layer 136 is formed of silicon oxide or silicon nitride. The stacked bodies 120 and 130 are connected to each other in the Z direction, thereby forming the stacked body 20. The plurality of conductive layers 126 and 132 become the plurality of conductive layers 22 of the stacked body 20. The plurality of insulating layers 124 and 134 become the plurality of insulating layers 24 of the stacked body 20.

Next, a plurality of holes H3 and H4 are formed in the stacked body 130 at a location where the plurality of holes H3 and H4 overlap the plurality of holes H1 and H2 in the X direction and the Y direction (Y direction is not illustrated) by using, for example, etching. Center parts in the X direction and Y directions of the surface 152a of the sacrificial layer 152 are exposed at respective bottom parts of the holes H3 and H4. Next, the sacrificial layer 152 in the holes H1 and H2 is removed by using a chemical solution or the like. By removing the sacrificial layer 152, the holes H1 and H3 are connected to each other in the Z direction, thereby forming a hole H5. The holes H2 and H4 are connected to each other in the Z direction, thereby forming a hole H6. Center parts in the X direction and the Y directions of the surface 32a of the semiconductor layer 32 of the wiring layer 30 are exposed at respective bottom parts of the holes H5 and H6.

Figure 5:
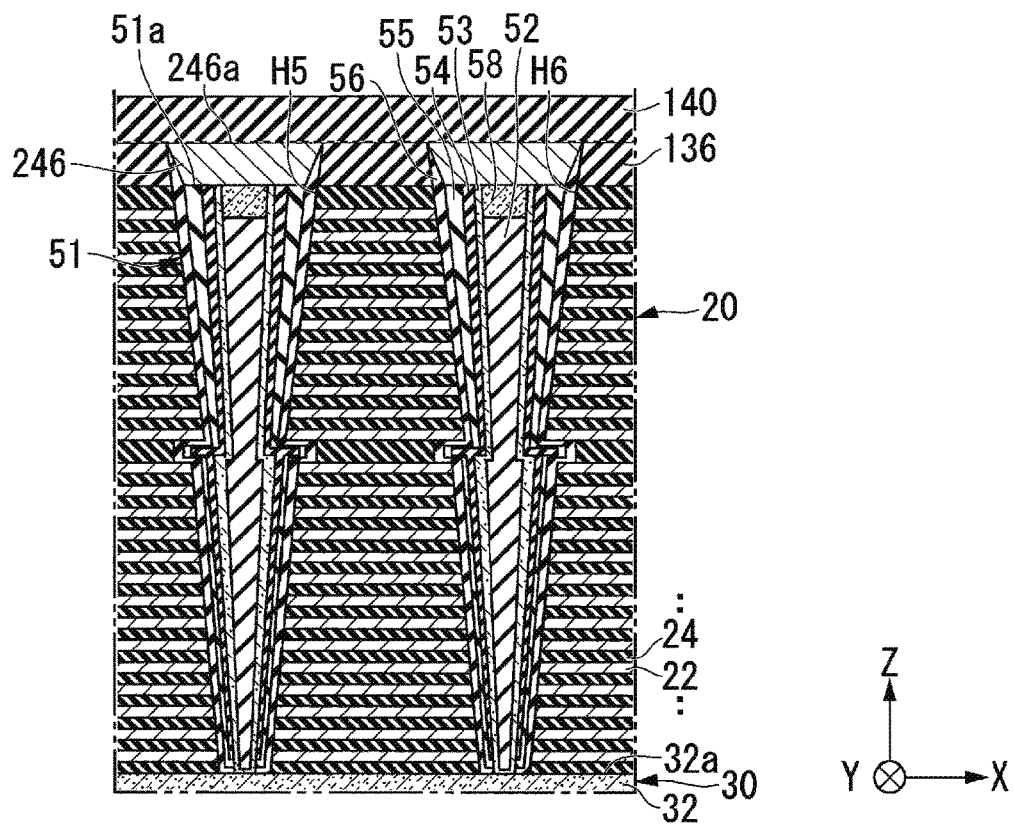
FIG. 5 is a cross-sectional view illustrating an example of the manufacturing process of the memory cell and the insulating slit.

As illustrated in FIG. 5, the barrier film 56, the charge storage film 55, the tunnel film 54, and the channel film 53 are sequentially formed on inner walls of the holes H5 and H6, and are filled with the core 52. More specifically, the barrier film 56, the charge storage film 55, and the tunnel film 54 are formed on the inner walls of the holes H5 and H6. Thereafter, respective bottom parts of the barrier film 56, the charge storage film 55, and the tunnel film 54 and center parts thereof in the X direction and the Y direction are removed by using, for example, etching or a chemical solution, and the surface 30a of the wiring layer 30 is exposed. Next, the channel film 53 is formed on the inner wall of the tunnel film 54 and an exposed portion at the bottom part of the tunnel film 54 and is filled with the core 52.

Next, a cap layer 58 is formed at an end part on the side opposite to the semiconductor layer 12 in the Z direction of the core 52 by, for example, patterning and etching. The cap layer 58 is formed of, for example, polycrystalline silicon. By performing the process, the first columnar body 51 is formed in each of the plurality of holes H5 and H6. The same components as those of the first columnar body 51 of the hole H5 are formed in the contact hole. Thereafter, the conductive layer 138 is removed, the insulating layer 136 at a location where the insulating layer 136 overlaps the surface 51a of the first columnar body 51 in the X direction is removed, and a contact part 246 is formed. An insulating layer 140 is formed on a surface 136a of the insulating layer 136 and a surface 246a of the contact part 246. The insulating layer 140 is formed of, for example, silicon oxide.

Figure 6:
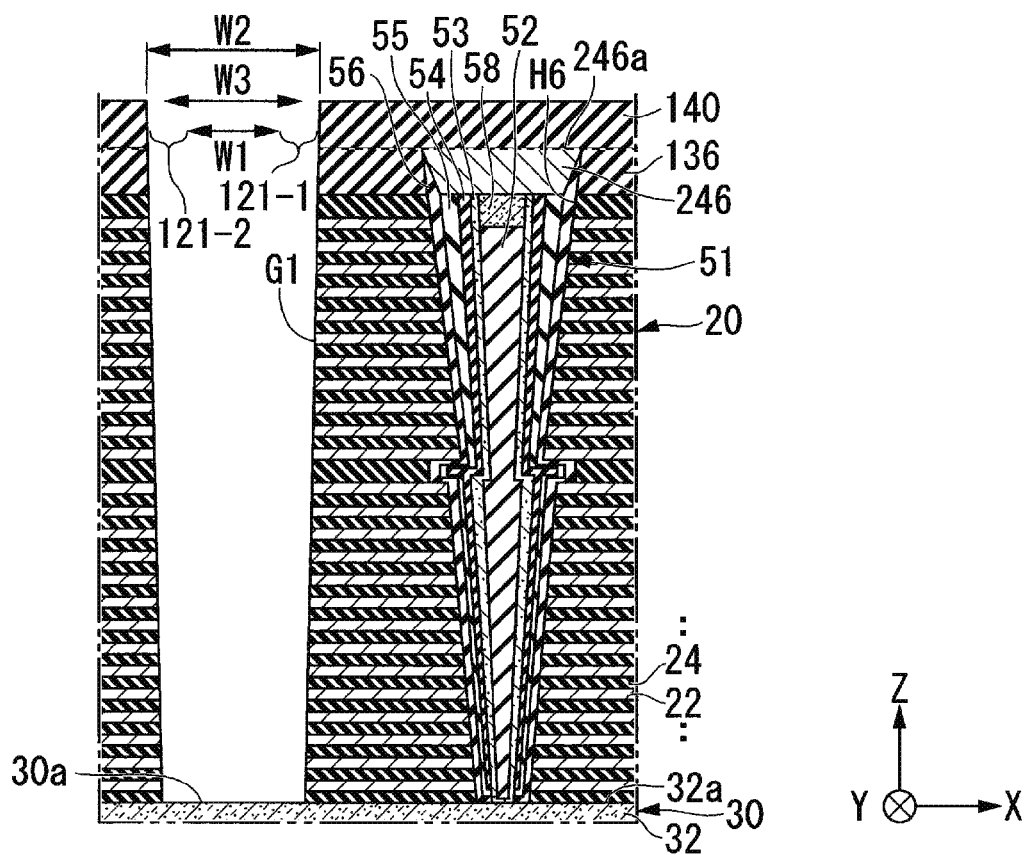
FIG. 6 is a cross-sectional view illustrating an example of the manufacturing process of the memory cell and the insulating slit.

As illustrated in FIG. 6, a groove G1 is newly formed while removing the first columnar body 51 of the hole H5 by, for example, reactive ion etching (RIE). The groove G1 extends in the Y direction and is formed at a location where the insulating film 100 is provided. A maximum width W1 in the X direction of the groove G1 that does not overlap the first columnar body 51 and the columnar body in the contact hole in the Y direction is smaller than a maximum width W3 in the X direction of the first columnar body 51. A maximum width W2 in the X direction of the groove G1 that overlaps the portion where the first columnar body 51 of the hole H5 is provided in the Y direction is greater than the maximum width W3 in the X direction of the first columnar body 51. That is, the groove G1 is widened in the X direction and the XX direction along an outer shape of the first columnar body 51 of the hole H5, and the first protruding parts 121-1 and 121-2 are formed. The wiring layer 30 is exposed at a bottom part of the groove G1.

A width in the X direction of the groove G1 that overlaps the portion where the columnar body of the contact hole is provided in the Y direction is greater than the maximum width W3 in the X direction of the first columnar body 51, and becomes greater than the maximum width W2 in the X direction of the groove G1. That is, the groove G1 is widened in the X direction and the XX direction along the outer shape of the columnar body of the contact hole, and the second protruding parts 122-1 and 122-2 are formed.

By performing the above-described process, the memory cell MC and the insulating slit ST illustrated in FIGS. 1 and 2 may be manufactured. The semiconductor storage device 1 is formed by performing a pretreatment process before the above-described process and performing a post-treatment process after the above-described process. However, the manufacturing method of the semiconductor storage device 1 is not limited to the method described above.

The plurality of columnar bodies 70 of the second group may be formed in the same process as that of the memory cell MC. However, when the plurality of columnar bodies 70 of the second group are formed, contact plug formation holes are formed at the same locations as the second columnar bodies 71 in the plurality of columnar bodies 70 of the second group when viewed from the Z direction in the X direction and the Y direction. The contact plug formation hole is filled with a conductive material such as tungsten.

In the manufacturing method of the above-described semiconductor storage device 1, the holes H1 to H4 are formed and the groove for forming memory holes MH and the insulating slits ST is formed in two stages in the Z direction, and when an opening area of the memory hole MH is in a predetermined range when viewed from the Z direction, the groove for forming the memory hole MH and the insulating slit ST may be formed in one stage in the Z direction, or may be formed in three or more stages.

Next, a function and an effect of the above-described semiconductor storage device 1 according to the first embodiment will be described. According to the semiconductor storage device 1, the first columnar body 51 is formed at a location where the first columnar body 51 overlaps the boundary region 105 where the insulating slit ST is to be formed in the X direction. According to the semiconductor storage device 1, when the groove G1 is formed by, for example, RIE, a path in the Z direction of the groove G1 is satisfactorily formed by the first columnar body 51 of the hole 5 without deviating from a formation location of the third portion 103 of the insulating film 100 in the X direction. For reference, FIG. 1 illustrates a formation location of the hole H1 and a formation location of a contact hole HC. In a semiconductor storage device which is a three-dimensional NAND type flash memory of the related art, since the first columnar body 51 of the hole H5 is not even temporarily formed, when a groove for providing the insulating slit ST is formed, the path of the groove is attracted to the channel film 53 of the first columnar body 51 of the memory cell MC that is closest in the X direction, and as a result, the insulating slit ST may contact the memory cell MC. When the insulating slit ST contacts the memory cell MC, a malfunction of the semiconductor storage device occurs. According to the semiconductor storage device 1, since the groove G1 is formed by being attracted to the first columnar body 51 of the hole H5 and the contact between the insulating slit ST and the memory cell MC is prevented, the reliability can be improved.

In the semiconductor storage device 1 according to the first embodiment, the insulating film 100 is formed in the groove G1 formed to extend from an outer peripheral surface viewed from the Z direction of the first columnar body 51 along a plane intersecting the Z direction while removing the temporarily formed first columnar body 51, and includes the first protruding parts 121-1 and 121-2 and the second protruding parts 122-1 and 122-2. According to the semiconductor storage device 1 of the first embodiment, the maximum width in the X direction in a range where the first protruding parts 121-1 and 121-2 and the second protruding part 122-1 and 122-2 are not formed in the Y direction of the insulating film 100 can be made smaller than the maximum width in the X direction of the memory cell MC. As a result, a formation region of the memory cell MC viewed from the Z direction in the semiconductor storage device 1 is widely allocated; the number of memory cells MC is increased compared to a semiconductor storage device of the related art in which all of the memory cells MC have the same size as that of the semiconductor storage device 1; and a capacity of the semiconductor storage device 1 can be increased.

In the semiconductor storage device according to the first embodiment, the first protruding part 121-1 may be provided only on the first side surface 111, and the first protruding part 121-2 may not be provided on the second side surface 112. In the semiconductor storage device according to the first embodiment, the first protruding part 121-2 may be provided only on the second side surface 112 without providing the first protruding part 121-1 on the first side surface 111.

Second Embodiment

Next, a configuration of a semiconductor storage device of a second embodiment will be described. In the same manner as the semiconductor storage device 1 according to the first embodiment, the semiconductor storage device according to the second embodiment is a three-dimensional NAND type flash memory. Hereinafter, with respect to components of the semiconductor storage device according to the second embodiment, contents different from components of the semiconductor storage device 1 will be described, and detailed description of contents common to the components of the semiconductor storage device 1 will be omitted.

Figure 7:
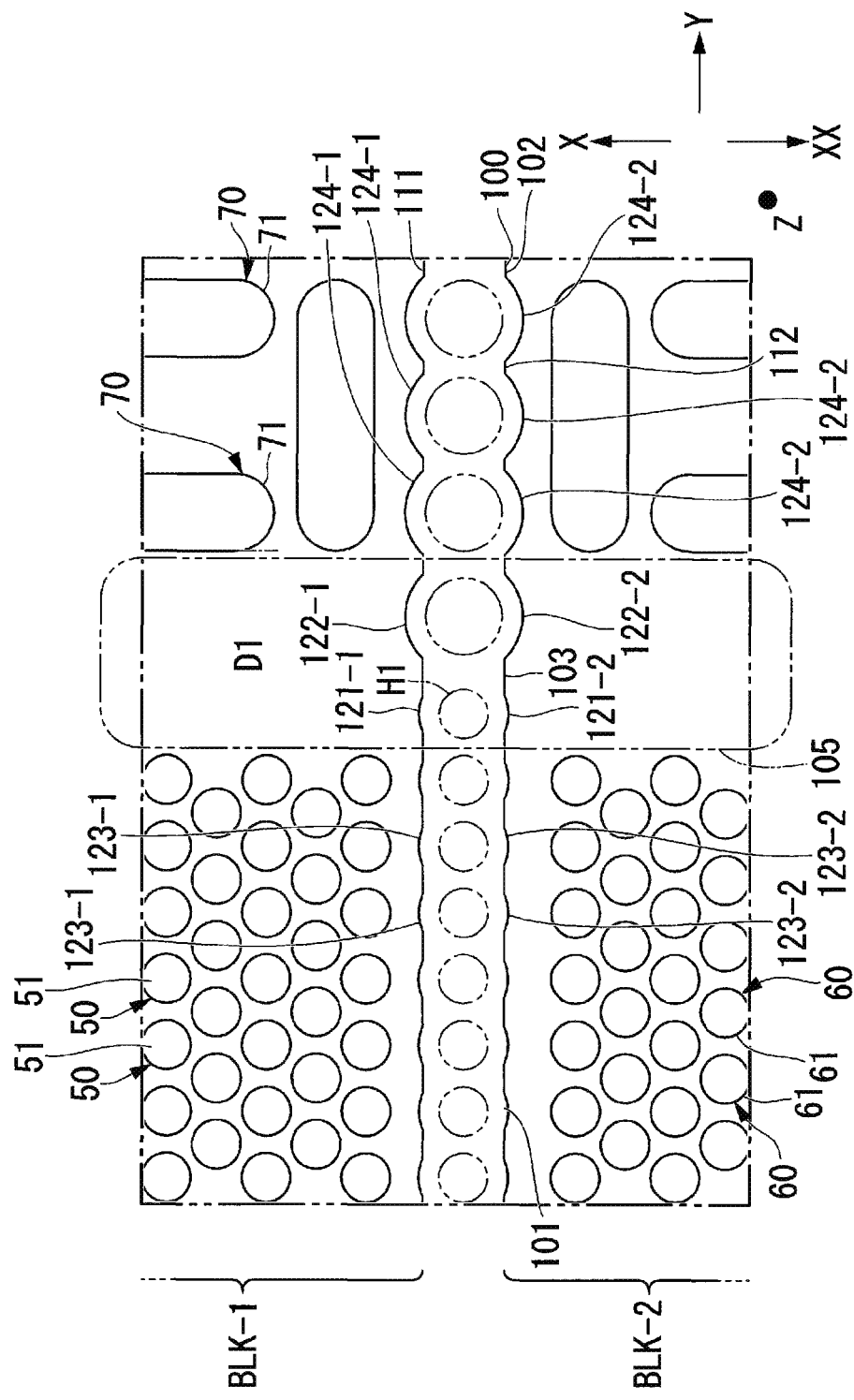
FIG. 7 is a plan view of a semiconductor storage device according to a second embodiment.

FIG. 7 is a plan view of a main part of the semiconductor storage device according to the second embodiment. As illustrated in FIG. 7, in the semiconductor storage device according to the second embodiment, the first portion 101 of the insulating film 100 includes a plurality of third protruding parts 123-1 on the first side surface 111 and a plurality of third protruding part 123-2 on the second side surface 112. Each of the plurality of third protruding parts 123-1 protrudes in a circular arc shape in the X direction from the first side surface 111. Each of the plurality of third protruding part 123-2 protrudes in a circular arc shape in the XX direction from the second side surface 112. The plurality of third protruding parts 123-1 and 123-2 are respectively arranged at equal intervals in the Y direction.

The second portion 102 of the insulating film 100 includes a plurality of fourth protruding parts 124-1 on the first side surface 111 and a plurality of fourth protruding parts 124-2 on the second side surface 112. Each of the plurality of fourth protruding parts 124-1 protrudes in a circular arc shape in the X direction from the first side surface 111. Each of the fourth protruding parts 124-2 protrudes in a circular arc shape in the XX direction from the second side surface 112. The plurality of fourth protruding parts 124-1 and 124-2 are arranged at equal intervals in the Y direction.

A manufacturing method of the memory cell MC and the insulating slit ST of the semiconductor storage device according to the second embodiment includes the same process as that of the manufacturing method of the semiconductor storage device 1 according to the first embodiment. However, when manufacturing the semiconductor storage device according to the second embodiment, the hole H1 is formed at a location where the hole H1 overlaps the plurality of third protruding parts 123-1 and 123-2 in the Y direction in addition to a location where the hole H1 overlaps the first protruding parts 121-1 and 121-2 in the Y direction. The contact hole HC is formed at a location where the contact hole HC overlaps the plurality of fourth protruding parts 124-1 and 124-2 in the Y direction in addition to a location where the contact hole HC overlaps the second protruding parts 122-1 and 122-2.

Since the semiconductor storage device according to the second embodiment has the same configuration as that of the semiconductor storage device 1 according to the first embodiment, in the same manner as the semiconductor storage device 1, the contact between the insulating slit ST and the memory cell MC can be prevented, and the reliability can be improved.

According to the semiconductor storage device of the second embodiment, since the insulating film 100 includes the plurality of third protruding parts 123-1 and 123-2 and the plurality of fourth protruding parts 124-1 and 124-2, the groove G1 is formed along the Y direction while being attracted to the first columnar bodies 51 of the plurality of holes H1, and the contact between the insulating slit ST and the memory cell MC can be prevented in the whole Y direction.

In the semiconductor storage device according to the second embodiment, the third protruding parts 123-1 and 123-2 may be provided in the first portion 101 of the insulating film 100 in addition to the first protruding parts 121-1 and 121-2; only the second protruding parts 122-1 and 122-2 may be provided in the second portion 102 of the insulating film 100; and the fourth protruding parts 124-1 and 124-2 may not be provided in the second portion 102 thereof. In the semiconductor storage device according to the second embodiment, only the first protruding parts 121-1 and 121-2 may be provided in the first portion 101 of the insulating film 100, and the third protruding parts 123-1 and 123-2 are not provided in the first portion 101 thereof; and the fourth protruding parts 124-1 and 124-2 may be provided in the second portion 102 of the insulating film 100 in addition to the second protruding parts 122-1 and 122-2.

Third Embodiment

Next, a configuration of a semiconductor storage device of a third embodiment will be described. In the same manner as the semiconductor storage device 1 according to the first embodiment, the semiconductor storage device according to the third embodiment is a three-dimensional NAND type flash memory. Hereinafter, with respect to components of the semiconductor storage device according to the third embodiment, contents different from components of the semiconductor storage device 1 will be described, and detailed description of contents common to the components of the semiconductor storage device 1 will be omitted.

Figure 8:
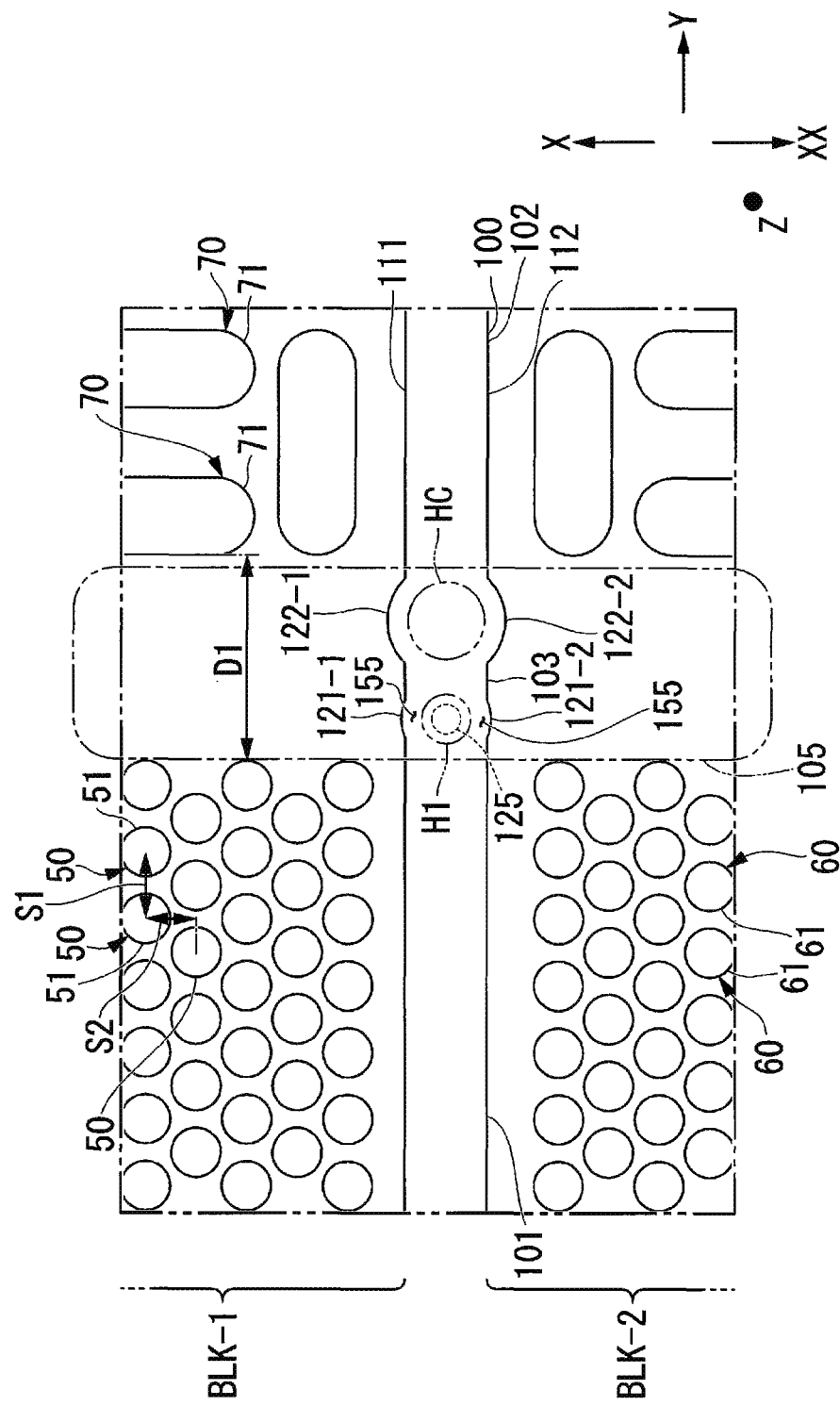
FIG. 8 is a plan view of a semiconductor storage device according to a third embodiment.
Figure 9:
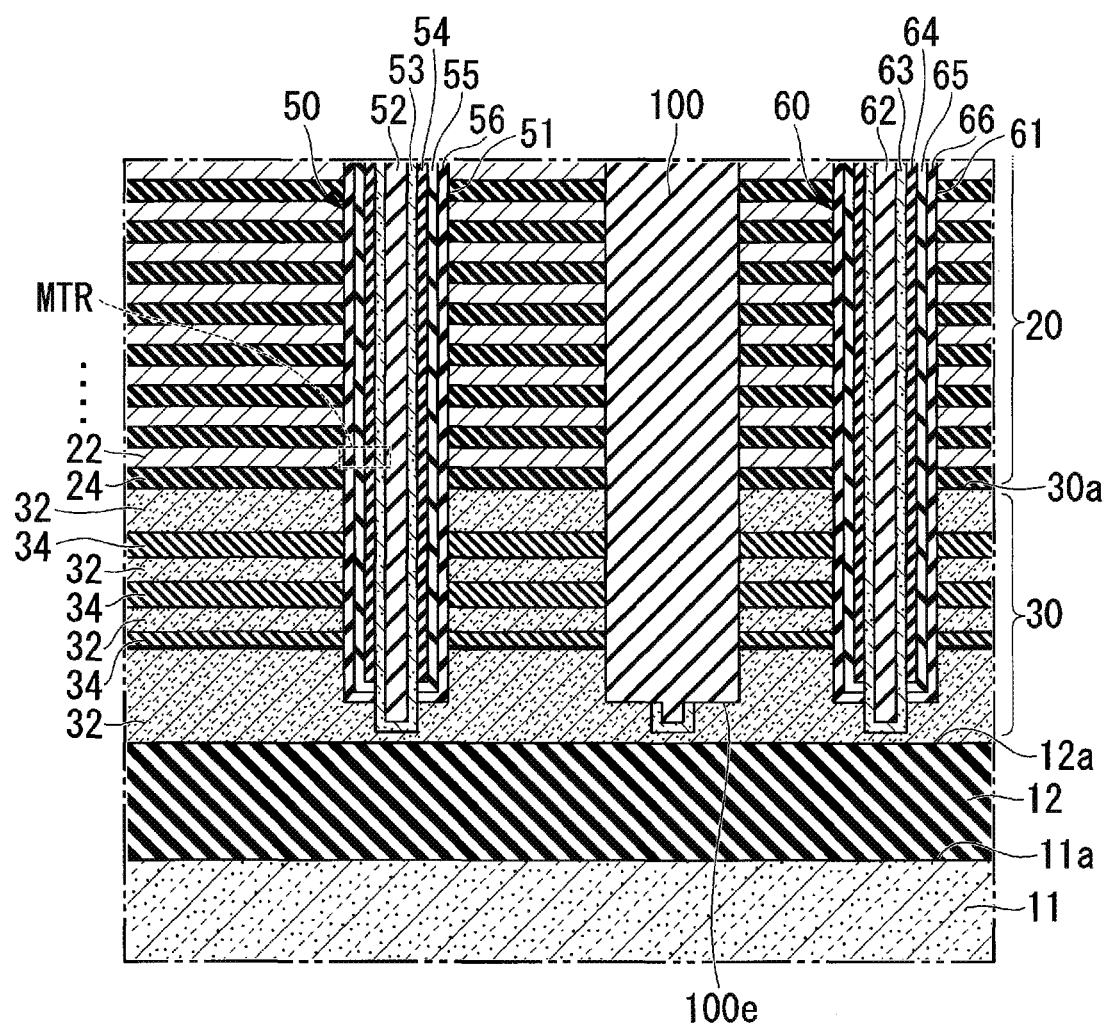
FIG. 9 is a cross-sectional view of the semiconductor storage device.

The semiconductor storage device according to the third embodiment includes the components of the semiconductor storage device 1 according to the first embodiment. FIG. 8 is a plan view of a main part of the semiconductor storage device according to the third embodiment. FIG. 9 is a cross-sectional view of the main part of the semiconductor storage device according to the third embodiment when viewed from the Y direction. The third portion 103 of the insulating film 100 includes a fifth protruding part 125. The fifth protruding part 125 is provided on a part of a bottom surface (e.g., an end surface) 100e of the insulating film 100 facing the silicon substrate 11 in the third portion 103 of the insulating film 100, and protrudes from the end surface toward the silicon substrate 11. The fifth protruding part 125 is provided adjacent to the insulating film 100 in the Z direction. The fifth protruding part 125 includes a semiconductor material and includes the same material as that of the first columnar body 51. For example, the fifth protruding part 125 includes a semiconductor film 311 and an insulating film 312 surrounded by the semiconductor film 311. The semiconductor film 311 includes, for example, the same material as that of the channel film 53. The insulating film 312 includes, for example, the same material as that of the core 52. The fifth protruding part 125 is in contact with the wiring layer 30.

A manufacturing method of the memory cell MC and the insulating slit ST of the semiconductor storage device according to the third embodiment includes the same process as that of the manufacturing method of the semiconductor storage device 1 according to the first embodiment. However, when manufacturing the semiconductor storage device according to the third embodiment, after forming the barrier film 56, the charge storage film 55, and the tunnel film 54 on the inner walls of the holes H5 and H6, respective bottom parts of the barrier film 56, the charge storage film 55, and the tunnel film 54 and the center parts thereof in the X direction and the Y direction are removed by using, for example, etching or a chemical solution, after which a recess portion is formed in the exposed semiconductor layer 32 of the wiring layer 30. The recess portion is recessed in a direction approaching the silicon substrate 11 in the Z direction from the bottom surfaces of the holes H5 and H6. Next, the channel film 53 is formed in a recess portion formed on the inner wall of the tunnel film 54 and the bottom part of the tunnel film 54, and is filled with the core 52.

When manufacturing the semiconductor storage device according to the third embodiment, for example, while leaving the channel film 53 and the core 52 of the above-described recess portion formed on the bottom surface of the hole H5 and then removing the first columnar body 51 of the hole H5 other than the channel film 53 and the core 52 by reactive ion etching (RIE), the groove G1 is newly formed. Therefore, the channel film 53 formed on the wall surface of the above-described recess portion and the core 52 buried in the channel film 53 remain at the center part in the X direction of the bottom part of the groove G1. The channel film 53 remaining in the above-described recess portion becomes the semiconductor film 311 illustrated in FIG. 9. The core 52 remaining in the above-described recess portion becomes the insulating film 312 illustrated in FIG. 9.

Since the semiconductor storage device according to the third embodiment has the same configuration as that of the semiconductor storage device 1 according to the first embodiment, in the same manner as the semiconductor storage device 1, the contact between the insulating slit ST and the memory cell MC can be prevented, and the reliability can be improved.

Fourth Embodiment

Next, a configuration of a semiconductor storage device of a fourth embodiment will be described. In the same manner as the semiconductor storage device 1 according to the first embodiment, the semiconductor storage device according to the fourth embodiment is a three-dimensional NAND type flash memory. Hereinafter, with respect to components of the semiconductor storage device according to the fourth embodiment, contents different from components of the semiconductor storage device 1 will be described, and detailed description of contents common to the components of the semiconductor storage device 1 will be omitted.

Figure 10:
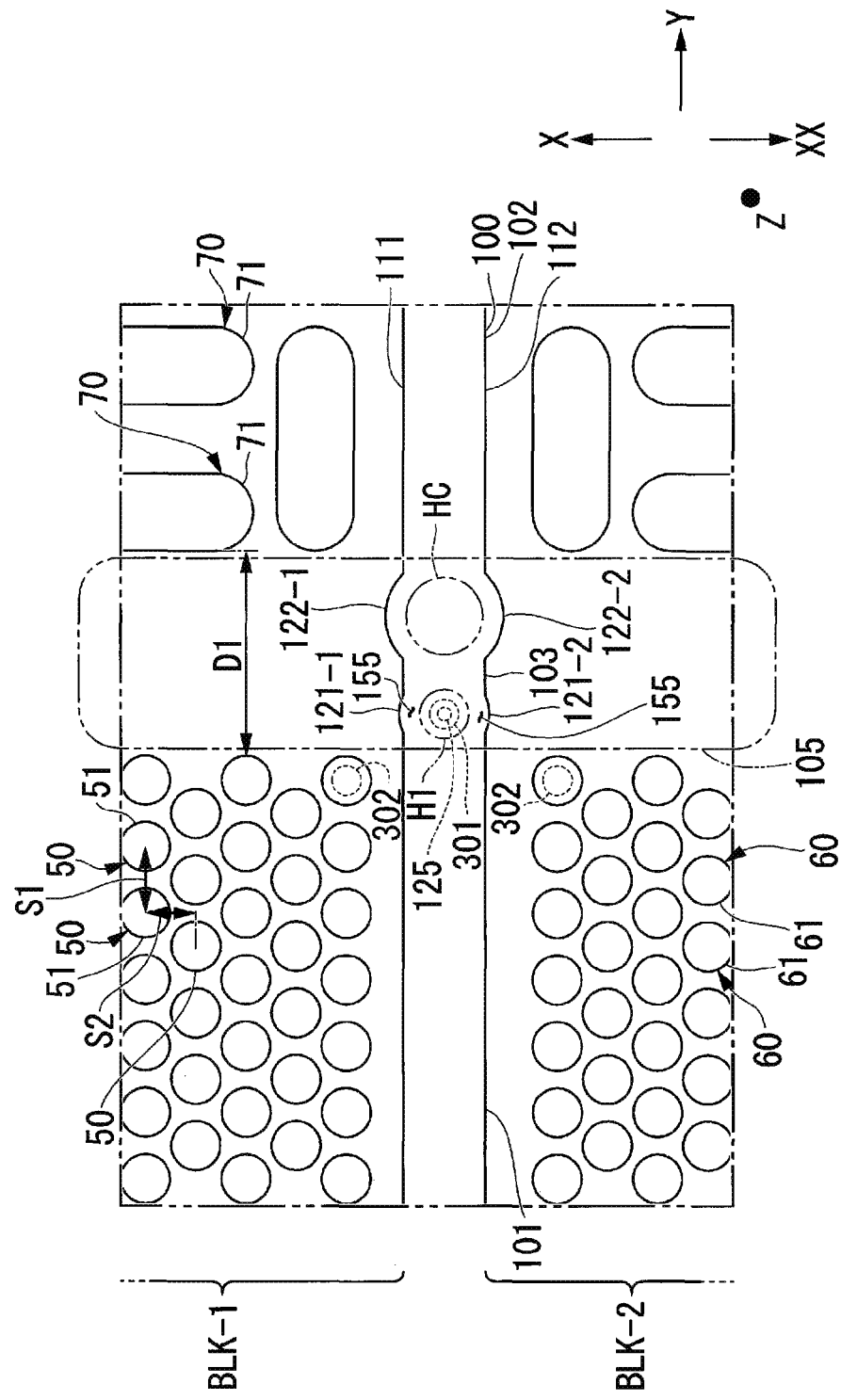
FIG. 10 is a plan view of a semiconductor storage device according to a fourth embodiment.
Figure 11:
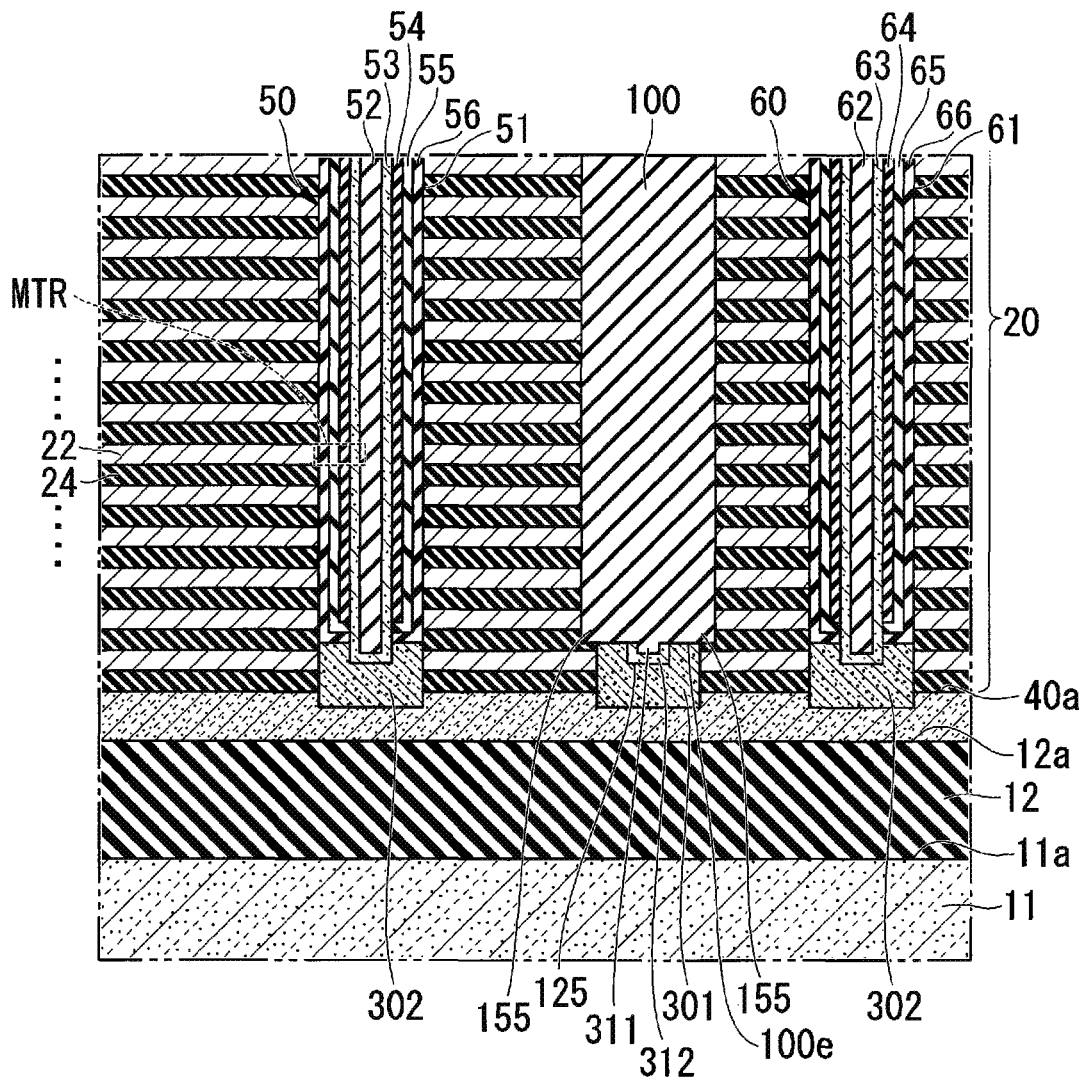
FIG. 11 is a cross-sectional view of the semiconductor storage device.

According to the semiconductor storage device of the fourth embodiment, the semiconductor storage device 1 includes, for example, the silicon substrate 11, a semiconductor layer 40, the stacked body 20, the plurality of columnar bodies 50 of the first group, the plurality of columnar bodies 70 of the second group, the plurality of columnar bodies 60 of the third group, the insulating film 100, a first semiconductor part 301, and a second semiconductor part 302. FIG. 10 is a plan view of a main part of the semiconductor storage device according to the fourth embodiment. FIG. 11 is a cross-sectional view of the main part of the semiconductor storage device according to the fourth embodiment when viewed from the Y direction. The semiconductor layer 40 is provided between the silicon substrate 11 and the stacked body 20 in the Z direction. The semiconductor layer 40 is formed of, for example, polycrystalline silicon.

As illustrated in FIG. 11, the first semiconductor part 301 is provided between the silicon substrate 11 and the insulating film 100 in the Z direction. The third portion 103 of the insulating film 100 includes a specific portion 155 arranged in the X direction with respect to the first protruding parts 121-1 and 121-2. The first semiconductor part 301 overlaps the specific portion 155 in the Z direction.

The second semiconductor part 302 is provided between the silicon substrate 11, the first columnar body 51, and the third columnar body 61 in the Z direction. The second semiconductor part 302 is provided adjacent to the insulating film 100 in the Z direction. The second semiconductor part 302 includes the same material as that of the first semiconductor part 301 on an end surface 100b in the Z direction of the insulating film 100. The first semiconductor part 301 and the second semiconductor part 302 are formed of, for example, single crystal silicon, and include, for example, silicon formed by epitaxial growth.

In the semiconductor storage device according to the fourth embodiment, the third portion 103 of the insulating film 100 includes the fifth protruding part 125 in the same manner as the third portion 103 of the insulating film 100 of the semiconductor storage device according to the third embodiment.

Next, a manufacturing method of the memory cell MC and the insulating slit ST of the semiconductor storage device according to the fourth embodiment will be briefly described. FIGS. 12 to 15 are cross-sectional views illustrating an example of a manufacturing process of the memory cell MC and the insulating slit ST. Hereinafter, contents different from the manufacturing method of the memory cell MC and the insulating slit ST of the semiconductor storage device 1 will be described, and detailed description common to the manufacturing method of the memory cell MC and the insulating slit ST of the semiconductor storage device 1 will be omitted.

Figure 12:
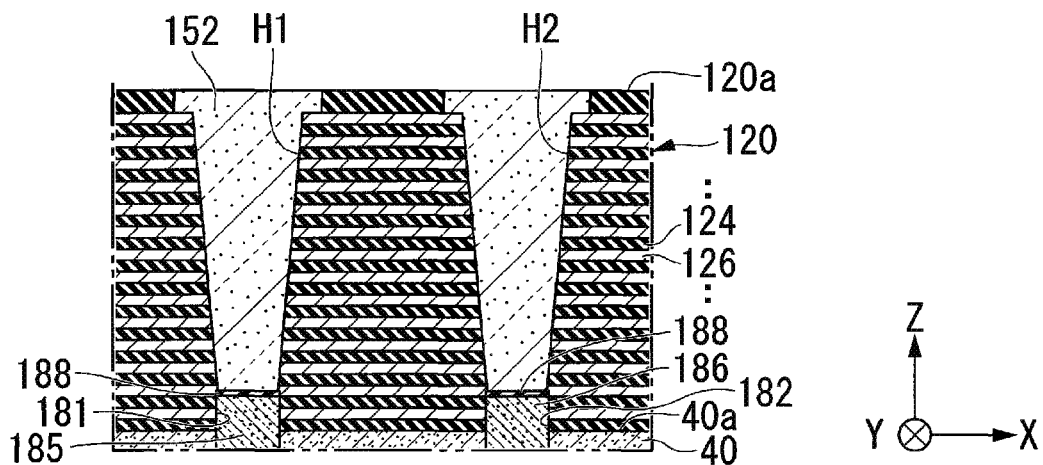
FIG. 12 is a cross-sectional view illustrating an example of a manufacturing process of a memory cell and an insulating slit according to the fourth embodiment.

As illustrated in FIG. 12, the conductive layers 126 and the insulating layers 124 are alternately stacked on a surface 40a of the semiconductor layer 40, thereby forming the stacked body 120. Next, the hole H1 and the plurality of holes H2 are formed in the stacked body 120 at predetermined intervals in the X direction and the Y direction (Y direction is not illustrated). A location where the hole H1 is formed in the X direction is an intermediate location between the first protruding parts 121-1 and 121-2 of the insulating film 100. A location where the hole H1 is formed in the Y direction is a location where the hole H1 overlaps the first protruding parts 121-1 and 121-2. A location where the plurality of holes H2 are formed in the X direction and the Y direction is the same as a location of the first columnar body 51 in the plurality of columnar bodies 50 of the first group. Next, a contact hole is formed at an intermediate location between the second protruding parts 122-1 and 122-2 in the X direction and at a location where the contact hole overlaps the second protruding parts 122-1 and 122-2 in the Y direction.

Next, recess portions 181 and 182 that are recessed on the side of the silicon substrate 11 in the Z direction are formed in the semiconductor layer 40 exposed at the bottom parts of the holes H1 and H2 (refer to FIG. 11). For example, single-crystal silicon is epitaxially grown from bottom parts of the recess portions 181 and 182 to a predetermined location in the Z direction of the holes H1 and H2, thereby forming semiconductor parts 185 and 186. An insulating film 188 such as silicon oxide is formed on each of a surface 185a of the semiconductor part 185 and a surface 186a of the semiconductor part 186, and the sacrificial layer 152 is filled in the holes H1 and H2 from a surface of the insulating film 188 to the surface 120a of the stacked body 120.

Figure 13:
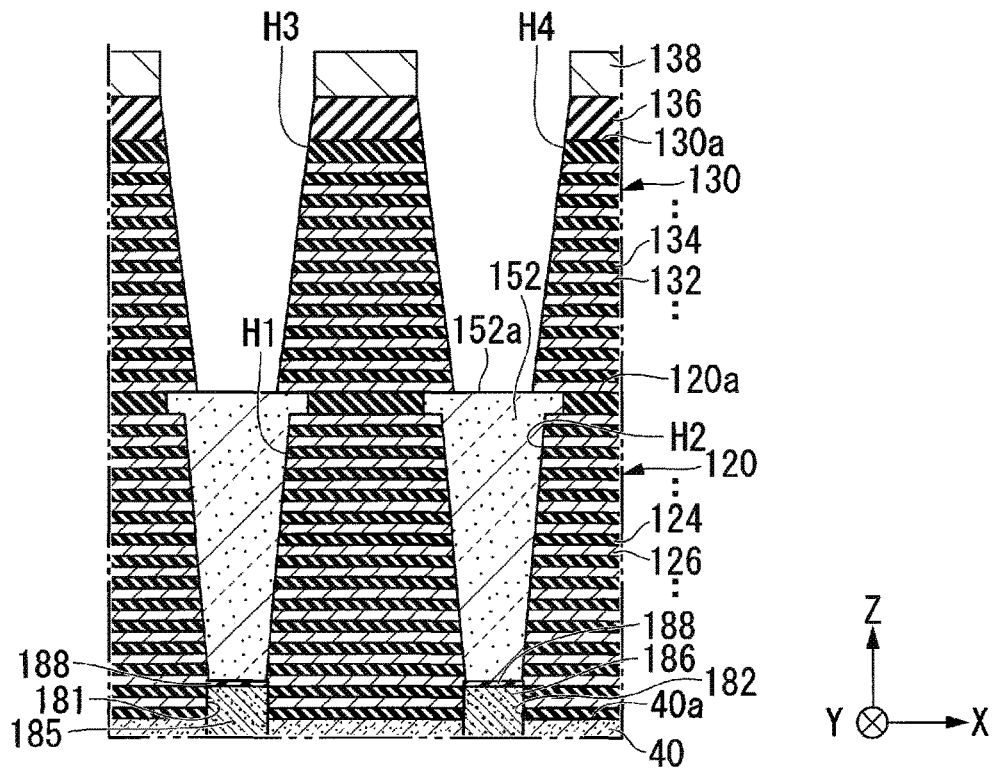
FIG. 13 is a cross-sectional view illustrating an example of the manufacturing process of the memory cell and the insulating slit.

As illustrated in FIG. 13, the conductive layer 132 and the insulating layer 134 are alternately stacked on the surface 120a of the stacked body 120 and the surface 152a of the sacrificial layer 152, thereby forming the stacked body 130. The insulating layer 136 and the conductive layer 138 are sequentially stacked on the surface 130a of the stacked body 130.

Next, the plurality of holes H3 and H4 are formed in the stacked body 130 at a location where the plurality of holes H3 and H4 overlap the plurality of holes H1 and H2 in the X direction and the Y direction (the Y direction is not illustrated) by, for example, etching. Next, the sacrificial layer 152 and the insulating film 188 in the holes H1 and H2 are removed by using a chemical solution or the like, and the holes H5 and H6 are formed. The semiconductor parts 185 and 186 are exposed at the respective bottom parts of the holes H5 and H6.

Figure 14:
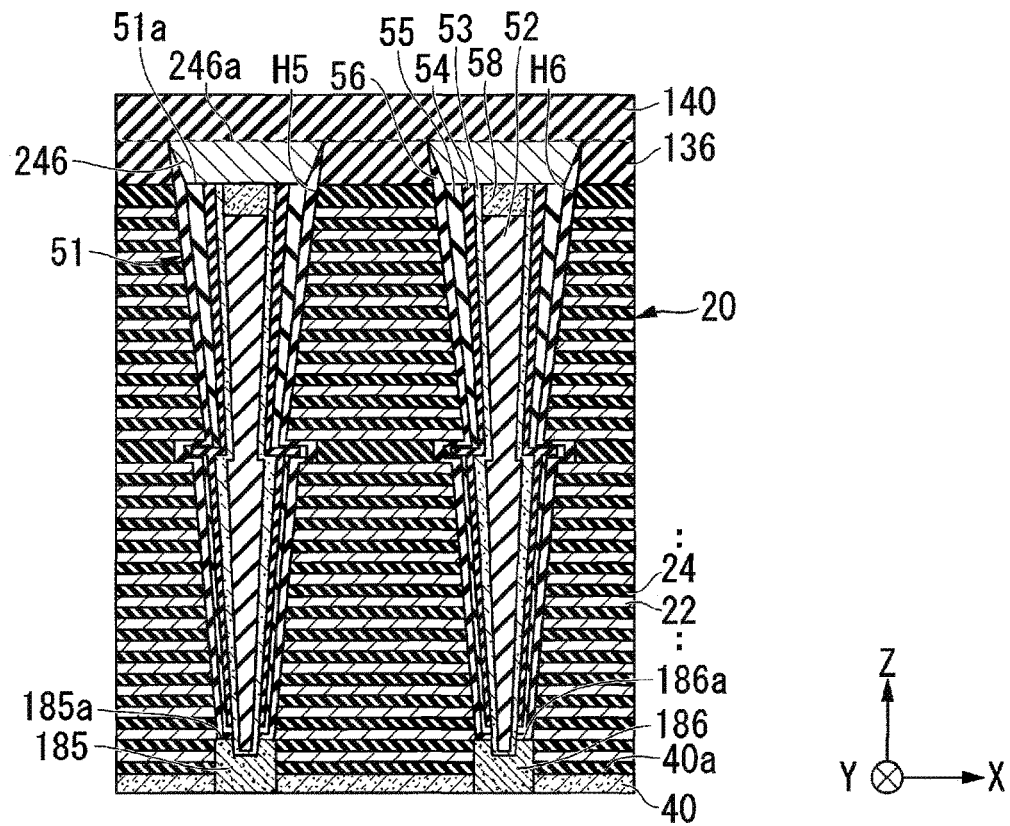
FIG. 14 is a cross-sectional view illustrating an example of the manufacturing process of the memory cell and the insulating slit.

As illustrated in FIG. 14, the barrier film 56, the charge storage film 55, the tunnel film 54, and the channel film 53 are sequentially formed on the inner walls of the holes H5 and H6, and are filled with the core 52. More specifically, the barrier film 56, the charge storage film 55, and the tunnel film 54 are formed on the inner walls of the holes H5 and H6. Thereafter, the respective bottom parts of the barrier film 56, the charge storage film 55, and the tunnel film 54, and the center parts thereof in the X direction and the Y direction are removed by using, for example, etching or a chemical solution, and recess portions 187 and 188 are respectively formed on the surfaces 185a and 186a of the semiconductor parts 185 and 186. Next, the channel film 53 is formed on the inner wall of the tunnel film 54 and the respective inner walls of the recess portions 187 and 188, and is filled with the core 52. The semiconductor part 186 becomes the second semiconductor part 302 illustrated in FIG. 11.

Next, the cap layer 58 is formed at the end part on the side opposite to the semiconductor layer 13 in the Z direction of the core 52 by, for example, patterning and etching. By performing the process, the first columnar body 51 is formed in each of the plurality of holes H5 and H6. The same components as those of the first columnar body 51 of the hole H5 are formed in the contact hole. Thereafter, the conductive layer 138 is removed, the insulating layer 136 at the location where the insulating layer 136 overlaps the surface 51a of the first columnar body 51 in the X direction is removed, and the contact part 246 is formed. The insulating layer 140 is formed on the surface 136a of the insulating layer 136 and the surface 246a of the contact part 246. The insulating layer 140 is formed of, for example, silicon oxide.

Figure 15:
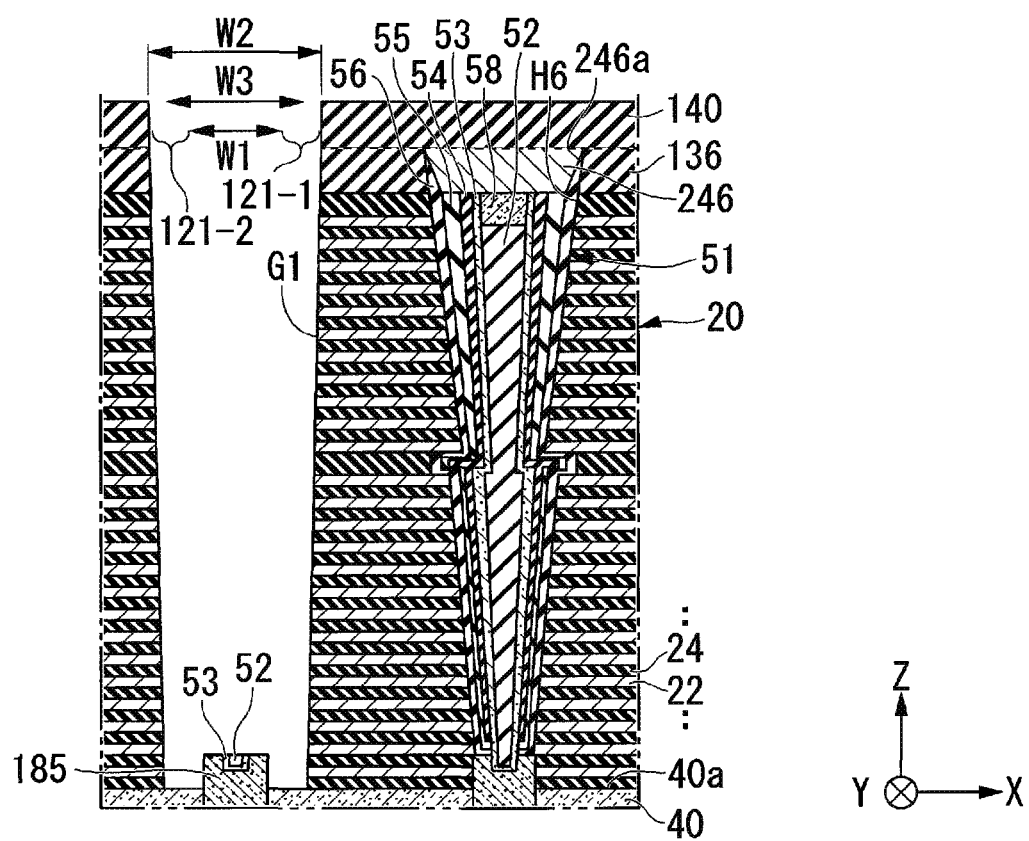
FIG. 15 is a cross-sectional view illustrating an example of the manufacturing process of the memory cell and the insulating slit.

As illustrated in FIG. 15, the groove G1 is formed while removing the first columnar body 51 of the hole H5 by, for example, reactive ion etching (RIE). Since the groove G1 is widened in the X direction and the XX direction along the outer shape of the first columnar body 51 of the hole H5, the first protruding parts 121-1 and 121-2 are formed. Since the groove G1 is widened in the X direction and the XX direction along the outer shape of the columnar body of the contact hole, the second protruding parts 122-1 and 122-2 are formed. At the bottom part of the groove G1, the semiconductor part 185 cut in the X direction, the Y direction, and the Z direction, the channel film 53 and the core 52 buried in the semiconductor part 185 from the surface 185a, and the surface 40a of the semiconductor layer 40 around the semiconductor part 185 when viewed from the Z direction are exposed. The semiconductor part 185 exposed at the bottom part of the groove G1 becomes the first semiconductor part 301 illustrated in FIG. 11. The channel film 53 and the core 52 buried in the semiconductor part 185 become the fifth protruding part 125 illustrated in FIG. 11.

By performing the above-described process, the memory cell MC and the insulating slit ST illustrated in FIGS. 10 and 11 may be manufactured. The semiconductor storage device according to the fourth embodiment is formed by performing a well-known pretreatment process before the above-described process and performing a well-known post-treatment process after the above-described process. However, the manufacturing method of the semiconductor storage device according to the fourth embodiment is not limited to the method described above.

Figure 17:
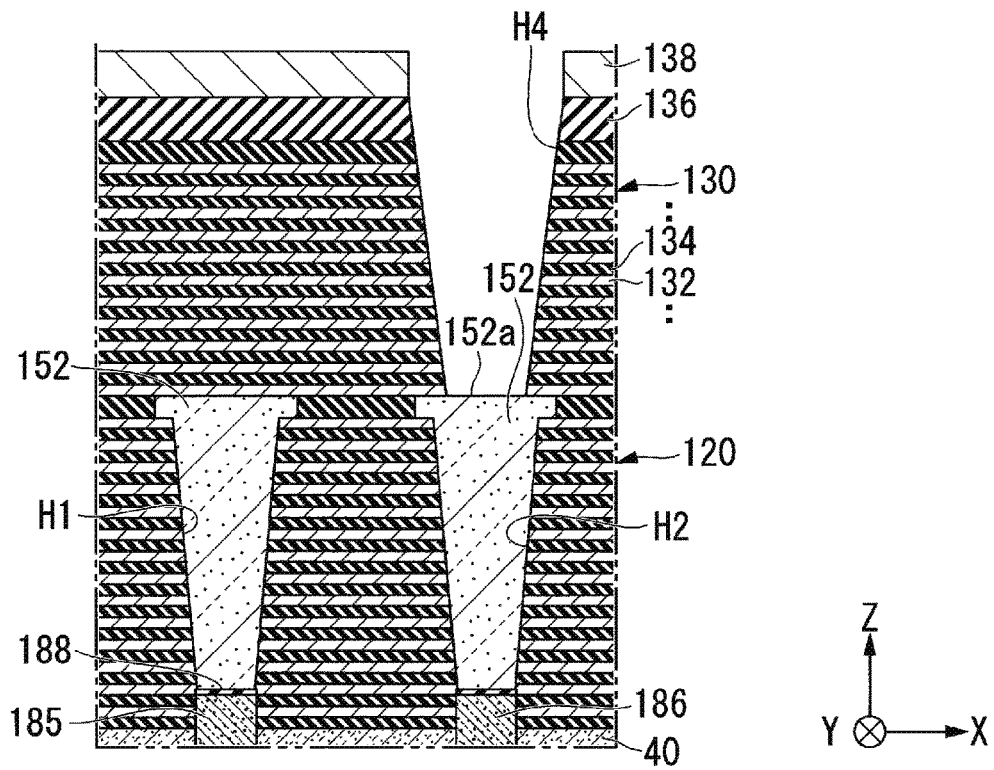
FIG. 17 is a cross-sectional view illustrating a modification of the manufacturing process of the memory cell and the insulating slit.

For example, in the above-described manufacturing method, after forming the hole H3, the sacrificial layer 152 of the hole H1 is removed and the hole H5 is formed, and each process may be performed as described below while leaving the sacrificial layer 152 of the hole H1. In the same manner as the above-described manufacturing method, the stacked body 130, the insulating layer 136, and the conductive layer 138 are sequentially stacked on the surface 120a of the stacked body 120 and the surface 152a of the sacrificial layer 152 illustrated in FIG. 12. As illustrated in FIG. 17, the plurality of holes H4 are formed only in the stacked body 130 at a location where the plurality of holes H4 overlap the plurality of holes H2 in the X direction and the Y direction (Y direction is not illustrated) by, for example, etching.

Figure 18:
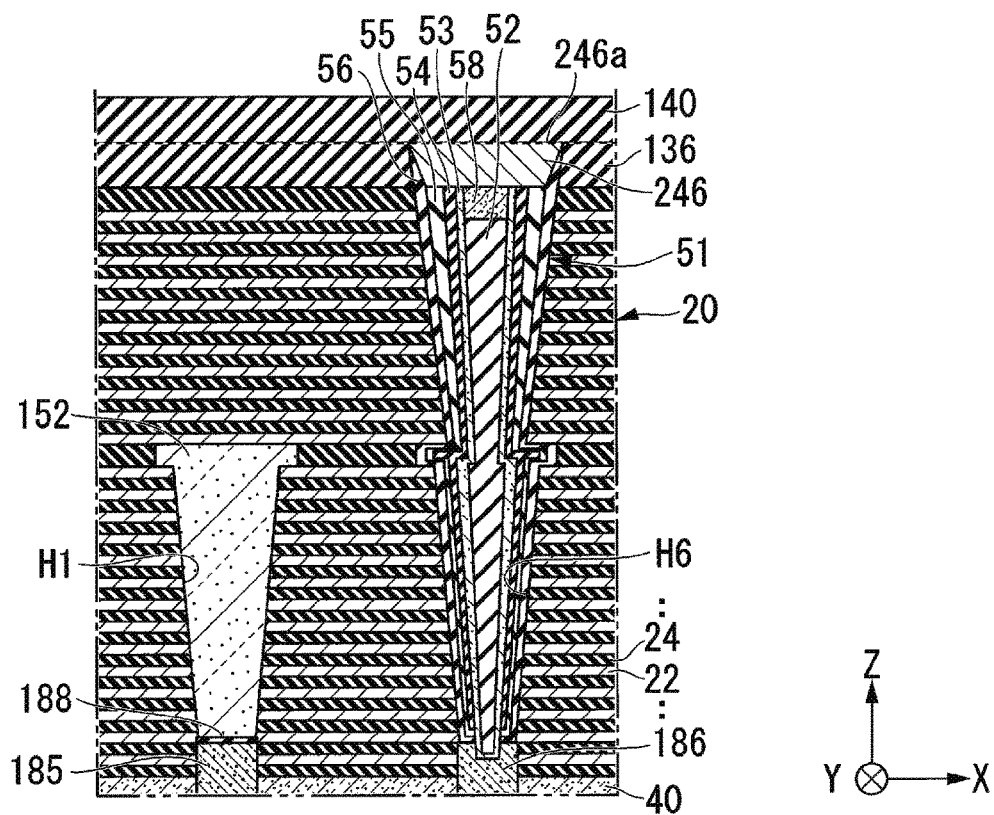
FIG. 18 is a cross-sectional view illustrating a modification of the manufacturing process of the memory cell and the insulating slit.

Next, the sacrificial layer 152 of the hole H2 is removed by using a chemical solution or the like, thereby forming the hole H6. As illustrated in FIG. 18, in the same manner as the above-described manufacturing method, the barrier film 56, the charge storage film 55, the tunnel film 54, and the channel film 53 are sequentially formed on the inner wall of the hole H6, and is filled with the core 52. Next, the cap layer 58 is formed at the end part on the side opposite to the semiconductor layer 13 in the Z direction of the core 52 of the hole H6 by, for example, patterning and etching. The sacrificial layer remains in the hole H1 also in the contact hole. Thereafter, the conductive layer 138 is removed, the insulating layer 136 at a location where the insulating layer 136 overlaps the surface 51a of the first columnar body 51 in the X direction is removed, and the contact part 246 is formed. In the same manner as the above-described manufacturing method, the insulating layer 140 is formed on the surface 136a of the insulating layer 136 and the surface 246a of the contact part 246.

Next, the groove G1 is formed while removing the stacked body 130 at a location where the stacked body 130 overlaps the sacrificial layer 152 of the hole H1 in the X direction and the Y direction and further removing the sacrificial layer 152 of the hole H1 by, for example, reactive ion etching (RIE). In the same manner as a state illustrated in FIG. 15, since the groove G1 is widened in the X direction and in the XX direction along the outer shape of the sacrificial layer 152 in the hole H1, the first protruding parts 121-1 and 121-2 are formed. Since the groove G1 is widened in the X direction and the XX direction along the outer shape of the sacrificial layer of the contact hole, the second protruding parts 122-1 and 122-2 are formed. At the bottom part of the groove G1, the semiconductor part 185 cut in the X direction, the Y direction, and the Z direction, the channel film 53 and the core 52 buried in the semiconductor part 185 from the surface 185a, and the surface 40a of the semiconductor layer 40 around the semiconductor part 185 when viewed from the Z direction are exposed. Although not illustrated, a recess portion may be formed at the center part in the X direction and the Y direction of the first semiconductor part 301 formed at the bottom part of the groove G1, and the semiconductor film 311 and the insulating film 312 may be buried in the inner wall of the recess portion.

Even when the sacrificial layer 152 of the hole H1 is left as described above, the memory cell MC and the insulating slit ST of the semiconductor storage device according to the fourth embodiment may be manufactured in the same manner as the case where the first columnar body 51 is formed in the hole H5. That is, since the groove G1 is formed to be attracted to the sacrificial layer 152 of the hole H1 and the contact between the insulating slit ST and the memory cell MC is prevented, the reliability of the semiconductor storage device according to the fourth embodiment can be improved. Even when the groove G1 does not reach the semiconductor layer 40 when the groove G1 is formed, since the first semiconductor part 301 is provided, contact resistance immediately above the hole H1 is reduced.

Since the semiconductor storage device according to the fourth embodiment has the same configuration as that of the semiconductor storage device 1 according to the first embodiment, in the same manner as the semiconductor storage device 1, the contact between the insulating slit ST and the memory cell MC can be prevented, and the reliability can be improved.

Fifth Embodiment

Next, a configuration of a semiconductor storage device of a fifth embodiment will be described. In the same manner as the semiconductor storage device according to the fourth embodiment, the semiconductor storage device according to the fifth embodiment is a three-dimensional NAND type flash memory. Hereinafter, with respect to components of the semiconductor storage device according to the fifth embodiment, contents different from components of the semiconductor storage device according to the fourth embodiment will be described, and detailed description of contents common to the components of the semiconductor storage device according to the fourth embodiment will be omitted.

Figure 16:
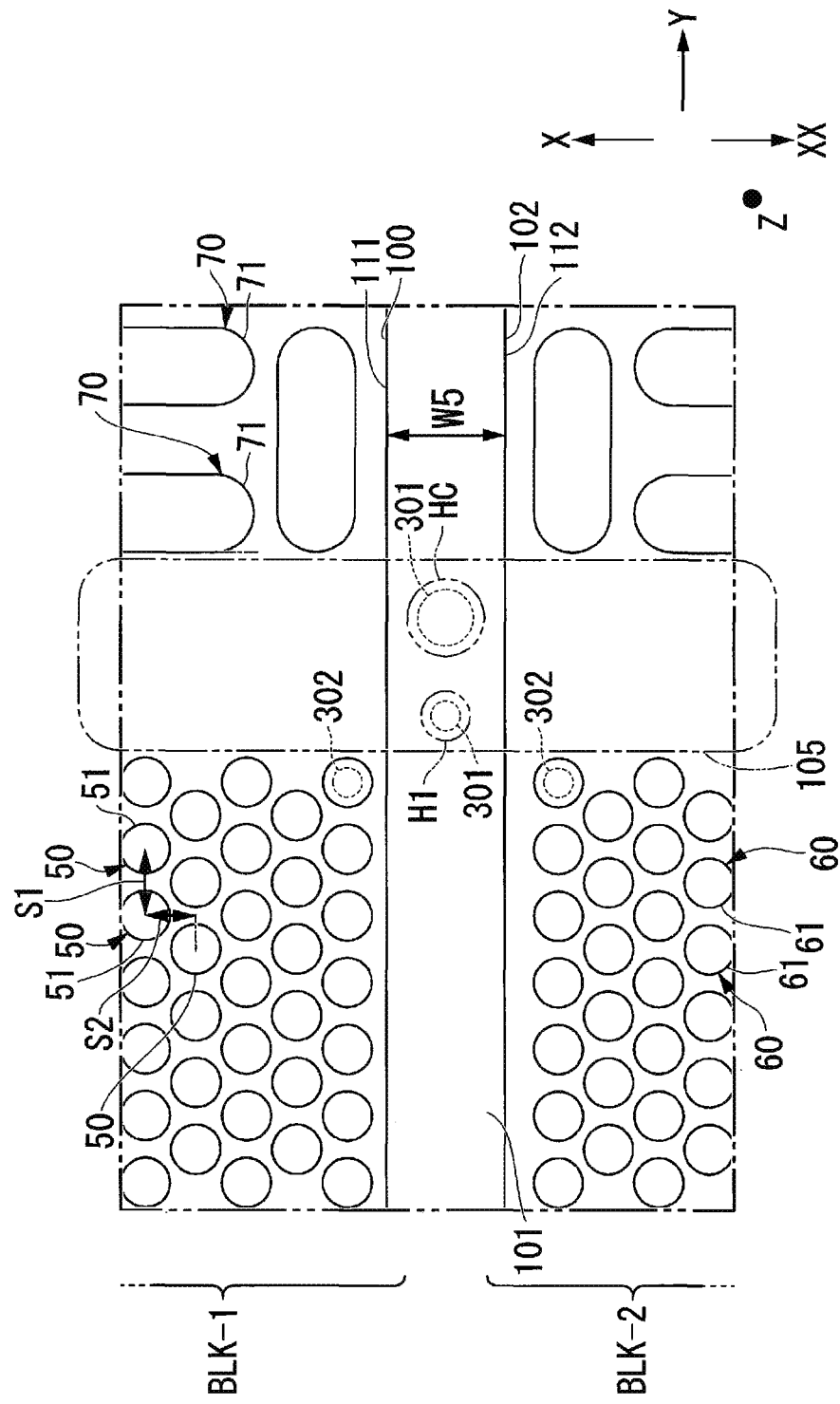
FIG. 16 is a plan view of a semiconductor storage device according to a fifth embodiment.

FIG. 16 is a plan view of a main part of the semiconductor storage device according to the fifth embodiment. The semiconductor storage device according to the fifth embodiment includes the components of the semiconductor storage device according to the fourth embodiment. However, in the semiconductor storage device according to the fifth embodiment, a maximum width W5 in the X direction of the first portion 101 and the third portion 103 of the insulating film 100 is greater than the maximum width W3 in the X direction of the first columnar body 51 of the semiconductor storage device according to the fourth embodiment, and is greater than the maximum width W2 in the X direction of the groove G1 of the semiconductor storage device according to the fourth embodiment.

In the semiconductor storage device according to the fifth embodiment, since the maximum width W5 in the X direction of the first portion 101 and the third portion 103 of the insulating film 100 is greater than the maximum width W3 in the X direction of the first columnar body 51, the first side surface 111 of the insulating film 100 does not include the first protruding part 121-1 and the second protruding part 122-1, and is formed in an approximately straight line shape along the Y direction. In the same manner, the second side surface 112 of the insulating film 100 does not include the first protruding part 121-2 and the second protruding part 122-2, and is formed in an approximately straight line shape along the Y direction.

A manufacturing method of the memory cell MC and the insulating slit ST of the semiconductor storage device according to the fifth embodiment includes the same process as that of the manufacturing method of the semiconductor storage device according to the fourth embodiment. However, when manufacturing the semiconductor storage device according to the fifth embodiment, the groove G1 is formed with the maximum width W5 that is greater in the X direction than the maximum width W2 in the X direction of the groove G1 of the semiconductor storage device according to the fourth embodiment. The maximum width W5 is a dimension sufficiently greater than the maximum width W3 in the X direction of the first columnar body 51, and a dimension in which the width in the Z direction of the groove G1 is not widened when the groove G1 advances in the Z direction while removing the first columnar body 51 of the hole H5.

Since the semiconductor storage device according to the fifth embodiment has the same configuration as that of the semiconductor storage device according to the fourth embodiment, in the same manner as the semiconductor storage device according to the fourth embodiment, the contact between the insulating slit ST and the memory cell MC can be prevented, and the reliability can be improved.

In the semiconductor storage device according to the fifth embodiment, the first semiconductor part 301 and the second semiconductor part 302 may be provided as described above, and the fifth protruding part 125 may not be provided in the third portion 103 of the insulating film 100. Conversely, in the semiconductor storage device according to the fifth embodiment, the fifth protruding part 125 may be provided in the third portion 103 of the insulating film 100 as described above without providing the first semiconductor part 301 and the second semiconductor part 302.

While certain embodiments have been described, these embodiments have been presented by way of example only, and are not intended to limit the scope of the inventions.

Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor storage device, comprising:
a stacked body including a plurality of conductive layers stacked in a first direction;
a plurality of columnar bodies of a first group that extend in the first direction in the stacked body, wherein a plurality of memory cell transistors are respectively formed at intersections of the conductive layers and the columnar bodies of the first group;
a plurality of columnar bodies of a second group that are arranged in a second direction intersecting the first direction, and respectively include an insulating material; and
an insulating film that extends in the first direction and the second direction in the stacked body, and divides the stacked body in a third direction intersecting the first direction and the second direction to include a first portion adjacent to the plurality of columnar bodies of the first group, a second portion adjacent to the plurality of columnar bodies of the second group, a third portion between the first portion and the second portion, and a first protruding part protruding from at least one side surface in the third direction in the third portion,
wherein the side surface includes a first side surface along the second direction and a second side surface located on a second side opposite to the first side surface, and
the first protruding part protrudes in the third direction from at least one of the first side surface or the second side surface in a cross section along the second direction and the third direction,
wherein at least one of the first side surface or the second side surface of the insulating film includes a second protruding part protruding in the same direction as the first protruding part at a location adjacent to a region between the plurality of columnar bodies of the first group and the plurality of columnar bodies of the second group in the second direction,
wherein the first protruding part is located closer to the plurality of columnar bodies of the first group than the plurality of columnar bodies of the second group,
the second protruding part is located closer to the plurality of columnar bodies of the second group than the plurality of columnar bodies of the first group, and
a protruding amount in the second direction of the second protruding part is greater than a protruding amount in the second direction of the first protruding part.

2. The semiconductor storage device according to claim 1, wherein
the plurality of columnar bodies of the first group are spaced apart from one another by a first interval in the second direction, and
the plurality of columnar bodies of the second group are separated from the plurality of columnar bodies of the first group by a first distance greater than the first interval in the second direction.

3. The semiconductor storage device according to claim 1, further comprising:
a plurality of columnar bodies of a third group provided in the third direction with respect to the columnar bodies of the first group, wherein
the columnar bodies of the first group are spaced apart from one another by a second interval in the third direction,
the columnar bodies of the third group are separated from the columnar bodies of the first group by a second distance greater than the second interval in the third direction, and
the insulating film is located between the columnar bodies of the first group and the columnar bodies of the third group.

4. The semiconductor storage device according to claim 1, wherein a second width in the second direction of at least one of the columnar bodies of the second group is greater than a first width in the second direction of at least one of the columnar bodies of the first group.

5. The semiconductor storage device according to claim 1, wherein
the first portion of the insulating film includes a plurality of third protruding parts, and
each of the plurality of third protruding parts protrudes in the third direction from the side surface.

6. The semiconductor storage device according to claim 5, wherein
each of the plurality of third protruding parts is arranged at equal intervals in the second direction.

7. The semiconductor storage device according to claim 1, wherein
the second portion of the insulating film includes a plurality of fourth protruding parts, and
each of the plurality of fourth protruding parts protrudes in the third direction from the side surface.

8. The semiconductor storage device according to claim 7, wherein
the plurality of fourth protruding parts are arranged at equal intervals in the first direction.

9. The semiconductor storage device according to claim 1, further comprising:
a first semiconductor part provided adjacent to the insulating film in the first direction, wherein
the third portion of the insulating film includes a sub portion arranged in the third direction with respect to the first protruding part, and
the first semiconductor part overlaps at least a part of the sub portion in the first direction.

10. The semiconductor storage device according to claim 9, further comprising:
a second semiconductor part provided adjacent to the columnar bodies of the first group in the first direction, wherein
the second semiconductor part and the first semiconductor part include the same material.

11. The semiconductor storage device according to claim 9, wherein
the first semiconductor part includes silicon formed by epitaxial growth.

12. The semiconductor storage device according to claim 1, further comprising:
a fifth protruding part that is provided along a part of an end surface of the insulating film in the third portion of the insulating film, and includes a semiconductor material.

13. The semiconductor storage device according to claim 12, wherein the fifth protruding part and the columnar bodies of the first group include the same material.

14. The semiconductor storage device according to claim 12, further comprising:
a wiring layer provided adjacent to the stacked body in the first direction, wherein
the fifth protruding part is in contact with the wiring layer.

* * * * *